United States Patent
Moon et al.

(10) Patent No.: US 11,404,541 B2
(45) Date of Patent: Aug. 2, 2022

(54) BINARY III-NITRIDE 3DEG HETEROSTRUCTURE HEMT WITH GRADED CHANNEL FOR HIGH LINEARITY AND HIGH POWER APPLICATIONS

(71) Applicant: HRL Laboratories, LLC, Malibu, CA (US)

(72) Inventors: Jeong-sun Moon, Moorpark, CA (US); Fevzi Arkun, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 38 days.

(21) Appl. No.: 16/926,700

(22) Filed: Jul. 11, 2020

(65) Prior Publication Data

US 2021/0013307 A1    Jan. 14, 2021

Related U.S. Application Data

(63) Continuation-in-part of application No. 16/217,714, filed on Dec. 12, 2018, now Pat. No. 10,714,605.

(60) Provisional application No. 62/630,688, filed on Feb. 14, 2018.

(51) Int. Cl.
| | |
|---|---|
| *H01L 29/778* | (2006.01) |
| *H01L 29/10* | (2006.01) |
| *H01L 29/66* | (2006.01) |
| *H01L 29/20* | (2006.01) |
| *H01L 29/205* | (2006.01) |

(52) U.S. Cl.
CPC ...... *H01L 29/1029* (2013.01); *H01L 29/2003* (2013.01); *H01L 29/205* (2013.01); *H01L 29/66462* (2013.01); *H01L 29/7786* (2013.01)

(58) Field of Classification Search
CPC .............. H01L 29/778; H01L 29/1029; H01L 29/66462
USPC ........................................................ 257/194
See application file for complete search history.

(56) References Cited

U.S. PATENT DOCUMENTS

| | | |
|---|---|---|
| 7,405,443 B1 | 7/2008 | Zuniga |
| 9,368,622 B1 | 6/2016 | Boutros |
| 9,379,327 B1 | 6/2016 | Rutherglen |
| 10,381,469 B2 | 8/2019 | Tsuchiya |
| 10,714,605 B2 | 7/2020 | Moon |
| 10,734,498 B1 | 8/2020 | Brown |
| 2005/0006639 A1 | 1/2005 | Dupuis |
| 2005/0077538 A1 | 4/2005 | Heikman |
| 2006/0244011 A1 | 11/2006 | Saxler |
| 2007/0001239 A1 | 1/2007 | Deleonibus |

(Continued)

OTHER PUBLICATIONS

PCT International Search Report and Written Opinion from PCT/US2018/065291 dated Apr. 22, 2019.

(Continued)

*Primary Examiner* — Mark V Prenty
(74) *Attorney, Agent, or Firm* — Ladas & Parry, LLP

(57) ABSTRACT

A HEMT comprising: a substrate; a channel layer coupled to the substrate; a source electrode coupled to the channel layer; a drain electrode coupled to the channel layer; and a gate electrode coupled to the channel layer between the source electrode and the drain electrode; wherein the channel layer comprises: at least a first GaN layer; and a first graded AlGaN layer on the first GaN layer, the Al proportion of the first graded AlGaN layer increasing with the distance from the first GaN layer.

16 Claims, 7 Drawing Sheets

(56) References Cited

U.S. PATENT DOCUMENTS

| | | | |
|---|---|---|---|
| 2009/0026501 | A1 | 1/2009 | Maher |
| 2010/0301395 | A1 | 12/2010 | Xu |
| 2012/0248416 | A1 | 10/2012 | Zhou |
| 2014/0361343 | A1 | 12/2014 | Sriram |
| 2017/0330940 | A1 | 11/2017 | Lee |
| 2019/0252535 | A1* | 8/2019 | Moon .................. H01L 29/201 |

OTHER PUBLICATIONS

Cao, Y., et al., "Radio frequency transistors using aligned semiconducting carbon nanotubes with current-gain cutoff frequency and maximum oscillation frequency simultaneously greater than 70 GHz", ACS Nano, vol. 10, pp. 6782-6790, 2016.

Chu, S.L.G., et al., "A highly linear MESFET", IEEE MTT-S Digest, 1991, pp. 725-728.

Hur, K. Y., "Ultralinear double pulse doped AlInAs/GaInAs/InP HEMTs", Electronics Letters, vol. 32, No. 16, pp. 1516-1518, 1996.

Ikalainen, P. K., "Low noise, low DC power linear FET", Microwave Conference, 1992, pp. 570-575.

Iwamoto, M., et al., "Linearity characteristics of GaAs HBTs and the influence of collector design", IEEE Transactions Microwave Theory and Techniques, vol. 48, No. 12, p. 2377-2388, Dec. 2000.

Moon, J.-S., et al., 2016 IEEE Topical Conference on Power Amplifiers for Wireless and Radio Applications (PAWR), pp. 5-7 (2016).

Moon, J.S., et al., "Linearity of low microwave noise AlGaN/GaN HEMTs", Electronics Letters, vol. 38, pp. 1358-1359, 2002.

Moon, J.S. et al., "70% Power-Added-Efficiency Dual-Gate, Cascode GaN HEMTs Without Harmonic Tuning", IEEE Electron Device Letters, vol. 37, No. 3, Mar. 2016, pp. 272-275.

Palacios, T., et al., "Use of Double-Channel Heterostructures to Improve the Access Resistance and Linearity in GaN-Based HEMTs," IEEE Transaction Electron Devices, vol. 53, No. 3., pp. 562-565, 2006.

Park, P., et al., "Electron gas dimensionality engineering in AlGaN/GaN high electron mobility transistors using polarization," Applied Physics Letters, vol. 100, pp. 063507-01 to 063507-03, 2012.

Rajan, S. et al., AlGaNOGaN polarization-doped field-effect transistor for microwave power applications, Applied Physics Letters, vol. 84, No. 9, pp. 1591-1593, Mar. 2004.

Zhang, K., et all, "High-linearity AlGaN/GaN FinFETs for microwave power applications", IEEE Electron Device Letters, vol. 38, No. 5, pp. 615-618, May 2017.

From U.S. Appl. No. 16/217,714 (now U.S. Pat. No. 10,714,605), Notice of Allowance dated Mar. 12, 2020.

PCT International Preliminary Report on Patentability (Chapter II) from PCT/US2018/065291 dated Jul. 7, 2020.

Cao, et al., "High-mobility window for two-dimensional electron gases at ultrathin AlN/GaN heterostructures" Applied. Phys. Lett., vol. 90, p. 182112, 2007 (4 pages).

Commercial Product Datasheet from Qorvo GPF4001, 26-30 GHz GaN module, May 2020 (21 pages).

Hickman, et al., "High breakdown voltage in RF AlN/GaN/AlN quantum well HEMTs", IEEE Electron Device Letters, vol. 40, No. 8, pp. 1293-1296, Aug. 2019.

Moon, et al., "High-speed graded-channel AlGaN/GaN HEMTs with power-added-efficiency >70% at 30 GHz" Electronics Letters, vol. 56, p. 678-68-, Jun. 25, 2020.

Moon, et al., "Novel high-speed linear GaN technology with high efficiency", 2019 IEEE MTT-S International Microwave Symposium (IMS), Boston, MA, USA, 2019, pp. 1130-1132, doi: 10.1109/MWSYM.2019.8700832.

Muhtadi, et al, "High Electron Mobility Transistors with $Al_{0.65}Ga_{0.35}$ Channel Layers on Thick AlN/Sapphire Templates," IEEE Electron Device Letters, vol. 38, No. 7, Jul. 2017, pp. 914-917.

Rostomyan, et al., "Comparison of pMOS and nMOS 28 GHz high efficiency linear power amplifiers in 45 nm CMOS SOI", IEEE Conference on RF/Microwave Power amplifiers for Radio and Wireless Applications (PAWR), pp. 26-28, 2018.

Shinohara, et al. "Scaling of GaN HEMTs and Schottky DiodesFor Submillimeter-Wave MMIC Applications"; IEEE Transactions on Electron Devices, vol. 60, No. 10, Oct. 2013.

Xiao, et al., "High performance $Al_{0.10}Ga_{0.90}N$ channel HEMTs," IEEE Electron Device Letters, vol. 39, No. 8, Aug. 2018, pp. 1149-1151.

* cited by examiner

| AlN cap 2-8nm |
| GaN buffer |
| GaN template |
| Sapphire substrate |

PRIOR ART

FIG. 1

| GaN Cap |
| AlN barrier |
| GaN channel |
| AlN buffer |
| SiC substrate |

PRIOR ART

FIG. 2

BINARY III-NITRIDE 3DEG HETEROSTRUCTURE HEMT WITH GRADED CHANNEL FOR HIGH LINEARITY AND HIGH POWER APPLICATIONS

CROSS REFERENCE TO RELATED APPLICATIONS

The present application is a Continuation-In-Part of U.S. application Ser. No. 16/217,714, which was filed on Dec. 12, 2018 and is hereby incorporated by reference, and which itself claims priority of U.S. provisional application No. 62/630,688, which was filed on Feb. 14, 2018 and is hereby incorporated by reference.

GOVERNMENT CONTRACT

This invention was made with Government support under contract FA8650-18-C-7802 awarded by DARPA. The Government has certain rights in the invention

FIELD OF THE INVENTION

This presentation relates to High Electron Mobility Transistors, or HEMTs, in particular III-Nitride HEMTs.

BACKGROUND

It is known to manufacture III-Nitride HEMTs, in particular AlN/GaN HEMTs wherein a two-dimensional Electron Gas (2DEG) is formed in a channel layer close to the interface (heterojunction) of the channel layer with a barrier layer.

It is known that high frequency operation of HEMT devices at Ka band and above can be achieved by lateral scaling of the device dimensions and corresponding vertical scaling of the AlGaN/GaN epitaxial structure. However, scaling of the conventional AlGaN barrier results in a reduction of the sheet charge density due to a reduced polarization of AlGaN as a function of the barrier thickness. One method to mitigate this is to use an ultra-wide bandgap barrier such as AlN and obtain a high charge density with thinner barriers.

Recently, Yu Cao et al [1] investigated the evolution of the 2DEG as a function of the AlN barrier thickness (2-8 nm) on a GaN channel layer. They found that the 77K 2DEG density increased from $5.5 \times 10^{12}$/cm2 to $5.5 \times 10^{13}$/cm2 as the AlN barrier thickness increased from 2 to 7 nm. They determined that the biaxial strain relaxation beyond 7 nm AlN resulted in cracking of this layer and an associated deterioration of the electrical properties of the 2DEG. FIG. 1 illustrates the heterojunction structure used by Cao to study the evolution of the 2DEG as a function of the AlN barrier thickness on a GaN channel layer.

Also, Hickman et al [2] reported a high breakdown voltage AlN/GaN/AlN RF HEMT device with a breakdown voltage of 78V for a gate-drain spacing of 390 nm, which corresponds to ~2 MV/cm which is ~7x lower than the bulk breakdown value for AlN. In their paper they reported a 2DEG density of $2.9 \times 10^{13}$/cm2 and a mobility of 630 cm$^2$/V·s with the mobility degradation associated with high electron concentration and interface roughness scattering in the structure. Further, a reduced mobility was attributed to interfacial roughness (IR) of the structure. FIG. 2 illustrates the channel structure of the HEMT device of Hickman.

In both of these known structures, the channel was formed with a high density 2DEG which on another hand is associated with a detrimental reduction in breakdown voltage.

There exists a need for a HEMT having an increased breakdown voltage while sustaining a high charge in the channel.

SUMMARY

This presentation describes a HEMT that comprises a graded channel AlN/GaN/g-AlGaN/AlN (g denotes graded) scaled structure where the g-AlGaN is compositionally graded in order to generate a high mobility 3-Dimensional Electron Gas (3DEG) in the GaN and graded-AlGaN channel regions of a HEMT device. The structure can be grown on SiC, sapphire, silicon, bulk GaN or preferably bulk AlN substrates.

Because the channel charge is spread over a graded channel (3DEG), thereby eliminating high electric fields, the graded channel structure results in a desirable high breakdown voltage device.

Further, the high carrier density achieved by the 3DEG allows reducing the thickness of the known capping layers, or even canceling the capping layer altogether, thus desirably increasing the sensitivity of a HEMT according to embodiments of this presentation.

Further, using for example an AlN substrate allows replacing conventional back-barriers made of different materials, which may have a relatively high thermal conductivity, with a binary semiconductor material.

Further, using for example an AlN substrate allows eliminating interfaces between dissimilar materials and thus eliminates the thermal boundary resistance associated with such interfaces.

Embodiments of this presentation relate to the following concepts:

Concept 1. A three-terminal GaN HEMT device, in which the barrier layer comprises an AlN layer and the channel comprises a graded AlGaN layer on top of a GaN layer, Concept 2. A three-terminal graded-channel AlN/GaN HEMT device with a 3DEG layer in the graded AlGaN layer and GaN layer, Concept 3. A three-terminal graded-channel AlN/GaN HEMT device with a regrown n+GaN ohmic contact, SiNx dielectric layer on top, and metal T-shape gate, Concept 4. A three-terminal graded-channel AlN/GaN HEMT device with a regrown n+GaN ohmic contact, SiNx dielectric layer on top, and metal field-plate gate.

Concept 5. A HEMT comprising: a substrate; a channel layer coupled to the substrate; a source electrode coupled to the channel layer; a drain electrode coupled to the channel layer; and a gate electrode coupled to the channel layer between the source electrode and the drain electrode; wherein the channel layer comprises: at least a first GaN layer; and a first graded AlGaN layer on the first GaN layer, the Al proportion of the first graded AlGaN layer increasing with the distance from the first GaN layer.

Concept 6. The HEMT of Concept 5, wherein said substrate is an AlN substrate.

Concept 7. The HEMT of Concept 5, wherein said substrate is a SiC substrate.

Concept 8. The HEMT of Concept 5 further comprising: an AlN barrier layer on the channel layer.

Concept 9. The HEMT of Concept 5 further comprising: a back-barrier layer between the substrate and the channel layer.

Concept 10. The HEMT of Concept 9, wherein the back-barrier layer is an AlN back-barrier layer.

Concept 11. The HEMT of Concept 5, wherein the first graded AlGaN layer comprises AlxGA1-xN; wherein x varies from 0 to 0.2 over a thickness of the first graded AlGaN layer; and wherein the thickness of the first graded AlGaN layer is 1 to 6 nanometers. Preferably, the thickness of the first graded AlGaN layer is 2 to 6 nanometers.

Concept 12. The HEMT of Concept 11, wherein the thickness of the first GaN layer is 10 to 40 nanometers.

Concept 13. The HEMT of Concept 11, comprising on top of the channel layer an AlN barrier layer having a thickness of 2 to 4 nanometers.

Concept 14. The HEMT of Concept 13, comprising on top of the barrier layer an AlGaN capping layer having a thickness of 2 to 4 nanometers. Alternatively, the capping layer thickness is smaller than 2 nanometers.

Concept 15. The HEMT of Concept 13, comprising a passivation layer on top of and in contact with the barrier layer.

Concept 16. A method of manufacturing a HEMT comprising: providing a substrate; providing a channel layer coupled to the substrate; providing a source electrode coupled to the channel layer; providing a drain electrode coupled to the channel layer; and providing a gate electrode coupled to the channel layer between the source electrode and the drain electrode; wherein said providing a channel layer comprises: providing at least a first GaN layer; and providing a first graded AlGaN layer on the first GaN layer, the Al proportion of the first graded AlGaN layer increasing with the distance from the first GaN layer.

Concept 17. The method of Concept 16, wherein said substrate is an AlN substrate.

Concept 18. The method of Concept 16, wherein said substrate is a SiC substrate.

Concept 19. The method of Concept 16 further comprising providing an AlGaN barrier layer on the channel layer.

Concept 20. The method of Concept 16 further comprising providing a back-barrier layer between the substrate and the channel layer.

Concept 21. The method of Concept 20, wherein the back-barrier layer is an AlN back-barrier layer.

Concept 22. The method of Concept 16, wherein the first graded AlGaN layer comprises AlxGA1-xN; wherein x varies from 0 to 0.2 over a thickness of the first graded AlGaN layer; and wherein the thickness of the first graded AlGaN layer is 1 to 6 nanometers. Preferably, the thickness of the first graded AlGaN layer is 2 to 6 nanometers.

Concept 23. The method of Concept 22, wherein the thickness of the first GaN layer is 10 to 40 nanometers.

Concept 24. The method of Concept 22, comprising providing on top of the channel layer an AlN barrier layer having a thickness of 2 to 4 nanometers.

Concept 25. The method of Concept 24, comprising providing on top of the barrier layer an AlGaN capping layer having a thickness of 2 to 4 nanometers. Alternatively, the AlGaN capping layer has a thickness smaller than 2 nanometers.

Concept 26. The method of Concept 24, comprising providing a passivation layer on top of and in contact with the barrier layer.

BRIEF DESCRIPTIONS OF THE DRAWINGS

Example embodiments are illustrated in referenced figures of the drawings. It is intended that the embodiments and figures disclosed herein are to be illustrative rather than limiting.

FIG. 1 illustrates a known structure comprising a 2DEG.

FIG. 2 illustrates a portion of a known 2DEG HEMT.

DETAILED DESCRIPTION

In 2019, Moon et al. demonstrated a graded-channel AlGaN/GaN HEMT that can deliver more output power density than conventional AlGaN/GaN HEMTs due to the improved breakdown voltage at 30 GHz [3,4].

This presentation discloses a compositionally graded channel region to mitigate the reduced breakdown voltage of an AlN/GaN device. A HEMT device according to embodiments of this presentation comprises an AlN buffer (optional), a composite GaN/g-AlGaN channel and an AlN barrier layer. The graded channel region spreads the charge over the channel (3DEG) and thereby reduces the electric fields associated with high charge density that result in low breakdown voltage. In the present application, what is called a 3DEG is a charge distribution that is not concentrated in a sheet or essentially flat volume (2DEG) in the channel layer below the barrier layer, but rather over a depth determined by the graded AlGaN region of the channel layer. The 3DEG is present due to a spreading of the carrier distribution into the graded AlGaN channel layer below the AlN layer, as well as into the GaN channel layer. The extension is due to the g-AlGaN layer, which is not a conventional layer in GaN HEMTS.

Figure 3:
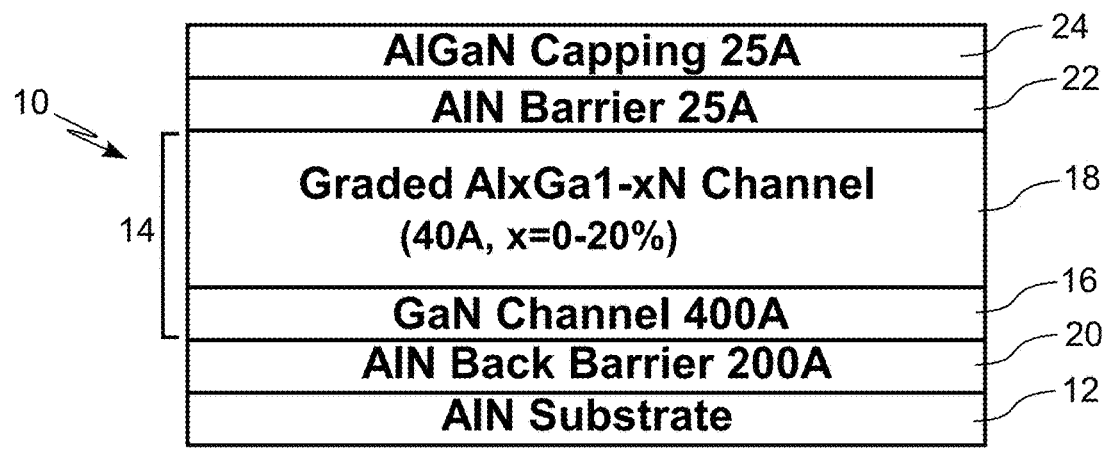
FIG. 3 illustrates a portion of a HEMT according to embodiments of this presentation.

FIG. 3 illustrates the structure of a portion of a HEMT (10) according to embodiments of this presentation, comprising a substrate (12); a channel layer (14) coupled to the substrate; a source electrode (not shown) coupled to the channel layer (14); a drain electrode (not shown) coupled to the channel layer (14); and a gate electrode (not shown) coupled to the channel layer (14) between the source electrode and the drain electrode. According to embodiments of this presentation, the channel layer (14) comprises: a GaN layer (16) formed on the substrate (12); and a graded AlGaN layer (18) formed on top of and in contact with the GaN layer (16), wherein the Al proportion of the graded AlGaN layer (18) increases with the distance from the GaN layer (16).

According to embodiments of this presentation, the graded AlGaN layer comprises AlxGA1-xN; wherein x varies from 0 to 0.2 over the thickness of the graded AlGaN layer (18). Preferably x varies from less than or equal to 0.05; preferably, or less than or equal to 0.03; most preferably, x varies from less than or equal to 0.01. Similarly, the maximum value of x is between 0.05 and 0.50; more preferably, it is between 0.10 and 0.30; most preferably, it is between 0.15 and 0.25.

According to embodiments of this presentation, the thickness of the graded AlGaN layer (18) is 1 to 6 nanometers. Preferably, it is 2 to 6 nanometers. Preferably it is 4 nanometers. According to embodiments of this presentation, the thickness of the GaN layer (16) is 10 to 40 nanometers.

According to embodiments of this presentation, an AlN barrier layer (22) is formed on top of and in contact with the channel layer (14). According to embodiments of this presentation, the AlN barrier layer (22) has a thickness of 2 to 4 nanometers.

According to embodiments of this presentation, the thickness of the AlN barrier layer (22) is 2.5 nanometers.

According to embodiments of this presentation, an AlGaN capping layer (24) is formed on top of and in contact with the barrier layer (22). According to embodiments of this presentation, the thickness of the AlGaN capping layer (25) is 2.5 nanometers. According to embodiments of this presentation, the AlGaN capping layer (24) has a thickness of 2.5 nanometer or less; preferably 2 nanometers or less.

According to alternative embodiments of this presentation, no capping layer is formed and a passivation layer (not shown) is formed on top of and in contact with the barrier layer (22).

According to embodiments of this presentation, the substrate (12) can be an AlN substrate or a SiC substrate. According to embodiments of this presentation, the use of a homoepitaxial substrate (12) such as AlN allows for improving the electrical and thermal properties of the device. Indeed, AlN has a very high breakdown voltage of 15 MV/cm (GaN 3 MV/cm) and high thermal conductivity of 300 W/mK (AlGaN 40 W/mK) which makes this material suitable for handling high voltages as well as dissipating heat generated in the active region of devices.

According to embodiments of this presentation, an AlN buffer or back-barrier (20) is formed between the substrate (12) and the channel layer (14). The back-barrier layer (20) can be an AlN back-barrier layer. In such a case, the device can be built on a monolithic structure i.e. the substrate (12) and buffer/back-barrier (20) material are identical, thereby desirably eliminating the thermal boundary resistance arising from the buffer/substrate interface in conventional HEMT device structures. Alternatively. The back-barrier layer can be an AlGaN layer.

In such embodiments, the device structure of a binary AlN substrate (12) and AlN buffer (20) with a graded AlGaN channel (18) on top of a GaN spacer/channel (16) result in:

1) a high charge density spread over the graded channel region (3DEG);

2) a high breakdown voltage due to spreading of the channel charge; and 3) improved thermal dissipation characteristics due to the high thermal conductivity substrate and eliminating the substrate/buffer interface thermal boundary resistance.

According to embodiments of this presentations, the disclosed graded-channel AlN/g-AlGaN/GaN HEMT devices can be provided with a very short-gate length (e.g. less than 50 nanometer), and optionally an aggressively scaled source-drain layout, to form linear amplifiers (e.g., power amplifier or low-noise amplifiers) with greatly reduced spectral distortion, thus allowing to meet demanding spectral efficiency and high output power in Ku to Q-band satellite communications.

It has been known for some time that the use of AlGaN in a channel layer reduces the mobility of electrons in the channel layer and degrades the device performance drastically, due to a reduced electron mobility caused by alloy scattering.

Muhtadi [8] reported on an Al0.65Ga0.35N channel device with an estimated channel mobility of 284 cm2/V·s which is 4-5× lower than an AlGaN/GaN HEMT device.

Xiao [9] reported an Al0.1Ga0.9N channel device with a mobility of 809 cm2/V·s which is roughly half the mobility value of a GaN channel device with only alloying the GaN channel with 10% Al.

A HEMT according to embodiments of this invention, however, maintains a high mobility in a GaN channel, while spreading the charge over the channel due to an additional graded AlGaN channel layer. The increase in the breakdown voltage without degrading the device performance of the disclosed device is an unexpected result mainly due to spreading the charge (wavefunction of electrons) over the channel and thereby reducing the electric field and increasing the breakdown voltage of the disclosed device compared to a similar device without a graded channel region.

Figure 4:
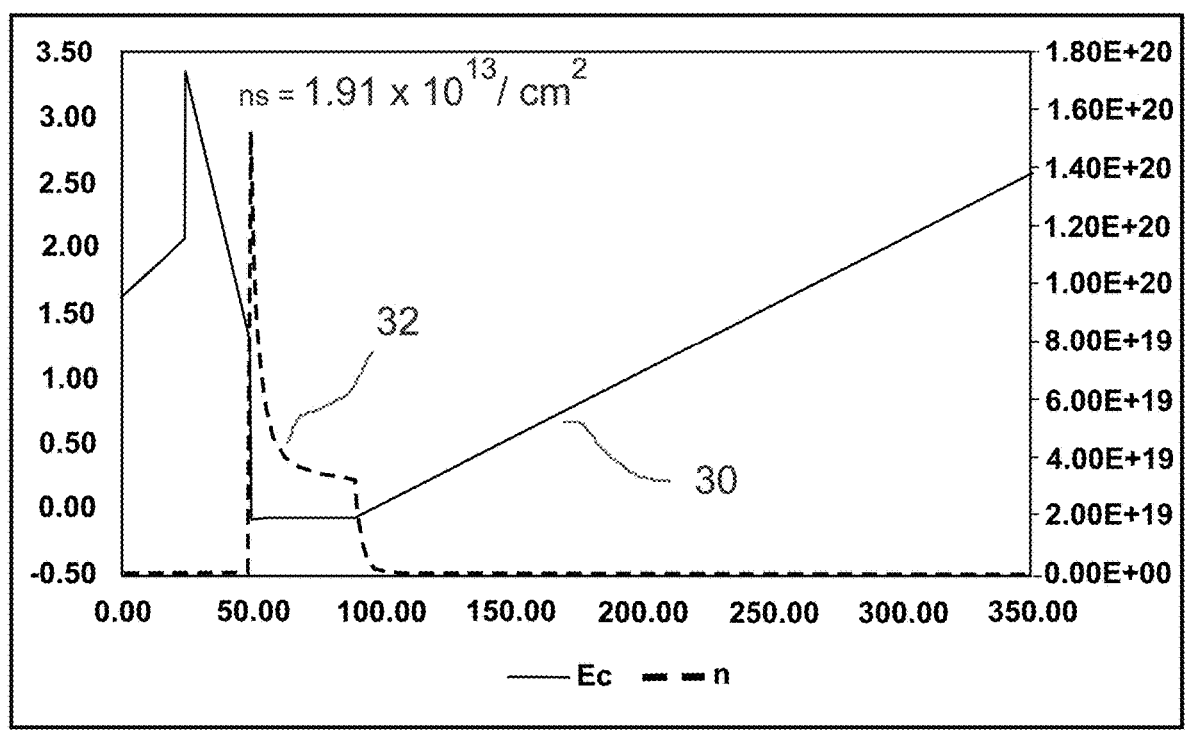
FIG. 4 illustrates the calculated conduction band edge energy and electron density as a function of depth for the HEMT of FIG. 3.

FIG. 4 illustrates the energy band diagram simulation of the portion of the AlN/GaN/g-AlGaN/AlN HEMT device such as illustrated in FIG. 3, under equilibrium conditions. In particular, FIG. 4 shows the simulated conduction band structure (30) and electron density distribution (32) showing the 3DEG formation in the channel with a net charge density of $1.91 \times 10^{13}/cm^2$, which is significantly higher than previous known AlGaN/GaN HEMTs such as disclosed in [5]. In other words, as illustrated by the energy band diagram, induced charge is spread over the channel region and a high charge density is maintained. The charge of $1.91 \times 10^{13}/cm^2$ is spread over the graded AlGaN and GaN channel. FIG. 4 relates to a 25 A thick AlGaN capping layer, from depth 0 to depth 25; a 25 A thick AlN barrier layer, from depth 25 to depth 50; a 40 A thick graded AlGaN layer, from depth 50 to depth 90, and a 400 A thick GaN channel layer, from depth 90 to depth 490 (not illustrated).

Figure 5:
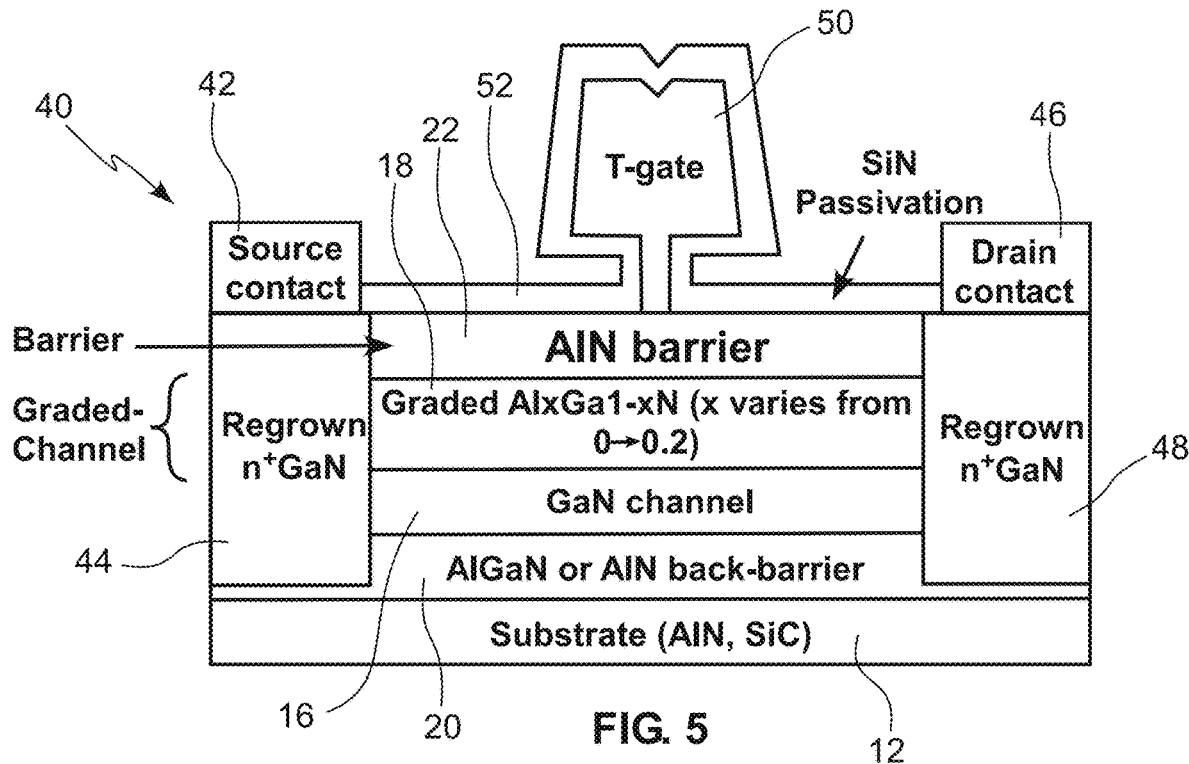
FIG. 5 is a schematic of a HEMT according to this presentation.

FIG. 5 schematically illustrates a graded-channel AlGaN/GaN HEMT device 40 according to embodiments of this presentation, wherein the same references relate to the same features as detailed in relation with FIG. 3. HEMT 40 comprises a source electrode (42) coupled to the channel layer (18, 16) by being formed on top of and in contact with a regrown n+GaN ohmic contact (44) itself formed in a trench in contact with the channel layer (16, 18). HEMT 40 further comprises a drain electrode (46) coupled to the channel layer (18, 16) by being formed on top of and in contact with a regrown n+GaN ohmic contact (48) itself formed in a trench in contact with the channel layer (16, 18). HEMT 40 further comprises a gate electrode (50) coupled to the channel layer (18, 16) between the source electrode (42) and the drain electrode (46) by being formed at least in part on top of and in contact with the barrier layer (22). A passivation layer 52, such as a SiNx layer, is formed on top of and in contact with the portions of the barrier layer (22) not in contact with the gate electrode (50). A portion of the gate electrode (50) can have a T-shape as illustrated in FIG. 5. The electrodes can be metal electrodes.

Figure 6:
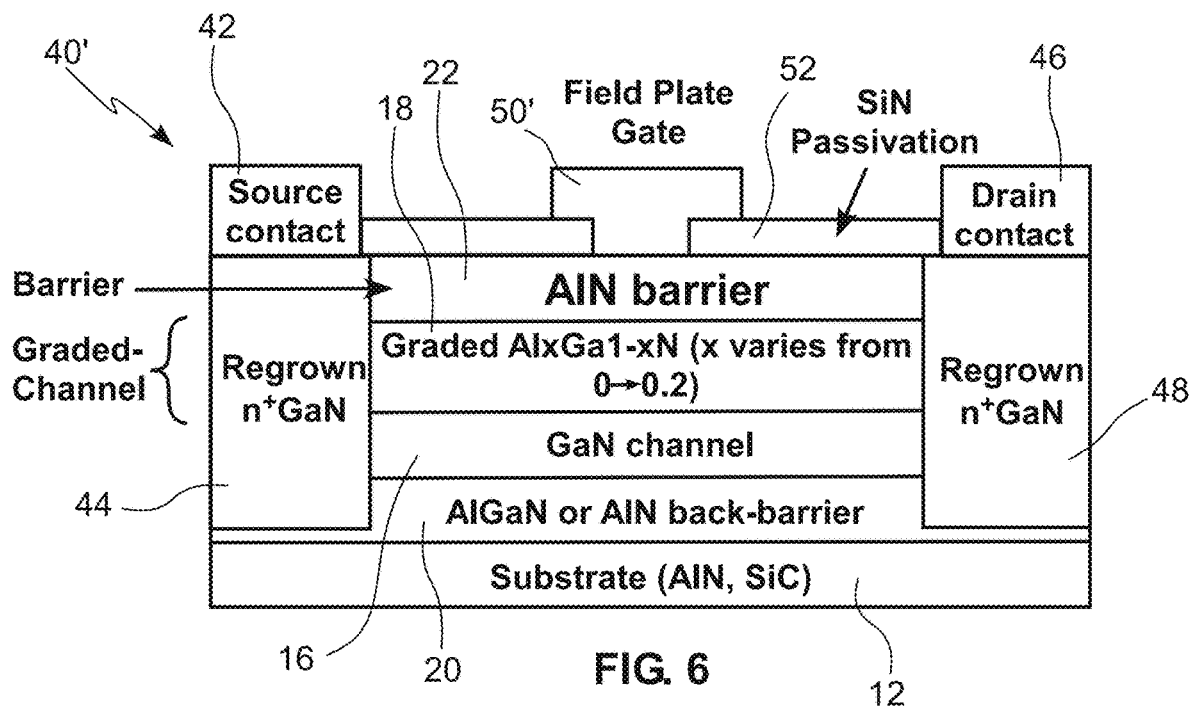
FIG. 6 is a schematic of a HEMT according to this presentation.

FIG. 6 schematically illustrates a graded-channel AlGaN/GaN HEMT device 40' according to embodiments of this presentation, having a structure similar as HEMT 40 above. However, the gate electrode 50' of HEMT 40' differs from the gate 50 of HEMT 40 in that a portion of gate electrode

50' is formed on top of and in contact with a portion of the passivation (52), thus forming field plates.

Figure 7:
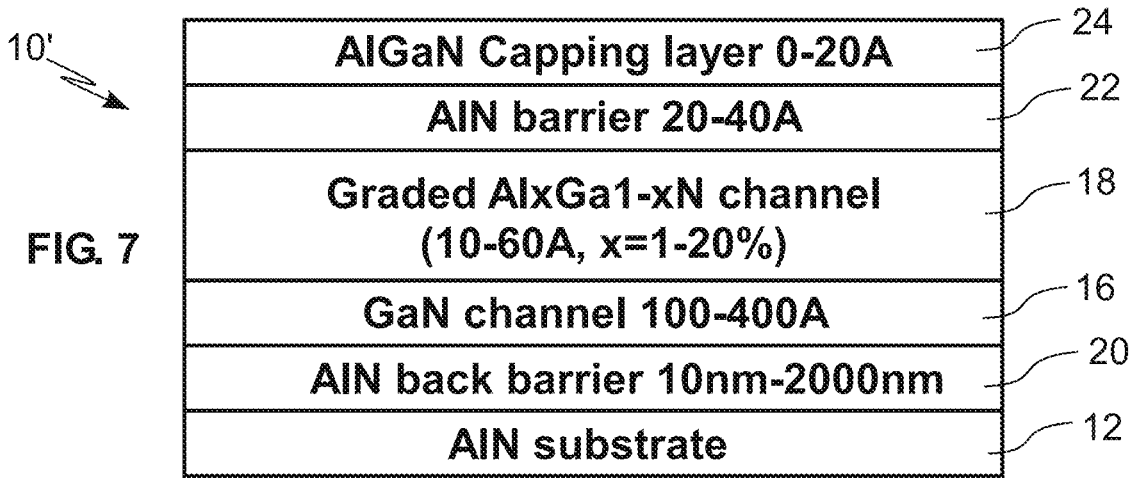
FIG. 7 illustrates a portion of a HEMT according to this presentation.

FIG. 7 illustrates the materials and thicknesses of the layers of a HEMT 10' according to embodiments of the HEMT 10 detailed in relation with FIG. 3.

In HEMT 10', the capping layer 24 is AlGaN and has a thickness of 2 nm or less. According to an embodiment, the thickness is 0 (no capping layer; the passivation is formed directly on barrier layer 22). In HEMT 10', the barrier layer 22 is AlN and has a thickness comprised between 2 and 4 nm. The graded channel AlGaN layer 18 has a thickness comprised between 1 nm and 6 nm, preferably between 2 and 6 nm, and is $Al_xGa_{1-x}N$, with x varying from 0.01 to 0.2 from the GaN channel layer 16 to the barrier layer 22. The GaN channel layer 16 is 10 to 40 nm thick, and the back-barrier layer 20 is AlN and has a thickness of 10 to 2000 nm.

The substrate 12 is AlN. Because the substrate (12) and back-barrier (20) material are identical, the interface between the substrate and the remainder of the HEMT structure comprise little or no electrical or thermal discontinuities. In HEMT 10', there is no heterointerface between AlN substrate 12 and AlN back-barrier 20; however, there remain the interfaces between AlN back-barrier 20 and GaN channel 16, between graded AlGaN channel 18 and AlN barrier 22, and between AlN barrier 22 and AlGaN capping layer 24.

The Inventors have noted that according to embodiments such as illustrated in FIG. 7, the very small distance between the gate electrode and the channel desirably increases the sensitivity of the HEMT. There exists a prejudice according to which a too thin capping layer causes surface depletion of carriers, whatever (practical) barrier layer thickness is used. The Inventors have noted that the charge density due to the 3DEG, the channel structure of this presentation allows having an important charge density even with a very thin capping layer (or no capping layer at all). According of embodiments of this presentation, the length of the gate is five times the depth of the barrier layer (* additionally including the depth of the capping layer, when there is a capping layer), or larger than five times the depth of the barrier layer (*). For example, for a 15 nm gate length (Lg) the barrier thickness (*) should be ~3 nm maximum for good charge control. Please see document [10], Section III paragraph 1. On another hand, the spreading of the charge density within the channel due to the 3DEG of this presentation allows maintaining a high breakdown voltage.

Figure 8:
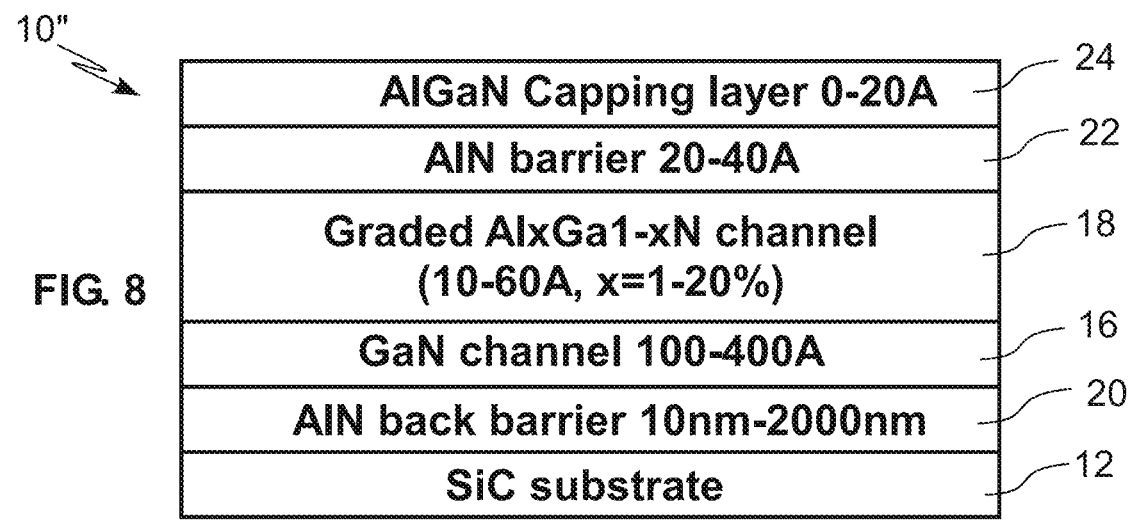
FIG. 8 illustrates a portion of a HEMT according to this presentation.

FIG. 8 illustrates the materials and thicknesses of the layers of a HEMT 10" according to embodiments of the HEMT 10 detailed in relation with FIG. 3. HEMT 10" is identical to HEMT 10' of FIG. 7, except that the substrate is SiC. The SiC substrate can be either 4H or 6H polytype.

Figure 9:
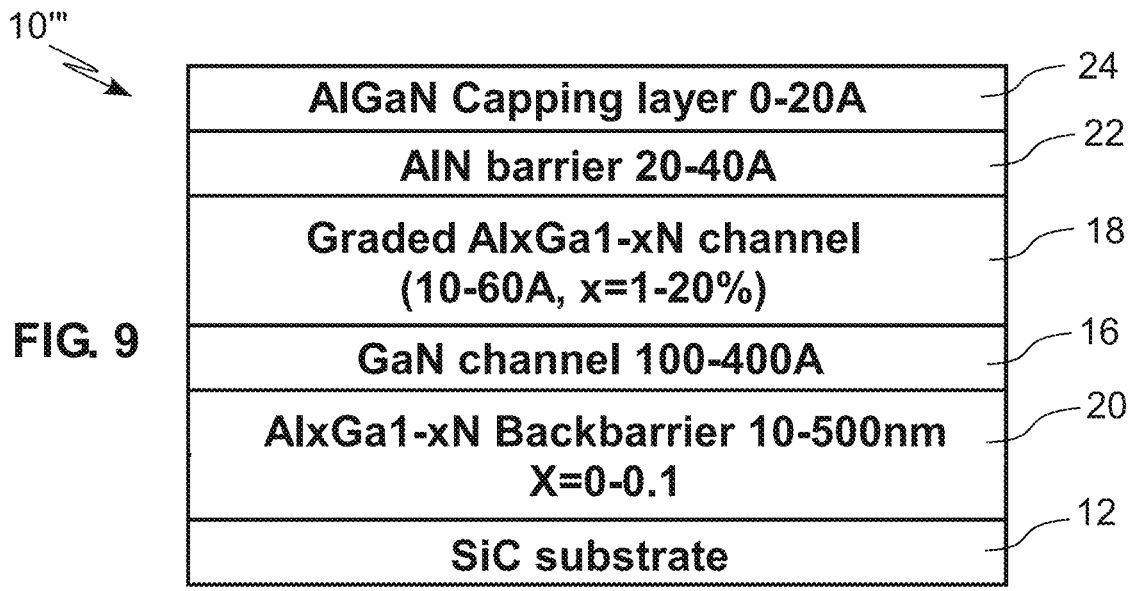
FIG. 9 illustrates a portion of a HEMT according to this presentation.

FIG. 9 illustrates the materials and thicknesses of the layers of a HEMT 10''' according to embodiments of the HEMT 10 detailed in relation with FIG. 3. HEMT 10''' is identical to HEMT 10" of FIG. 8, except that the back-barrier is $Al_xGa_{1-x}N$, with x=0.01 and is 10 to 500 nm thick.

Various transition layers can also be used to realize this structure: the Al percentage in g-AlGaN channel 18 may vary continuously (for example, linearly) as a function of depth, or it may vary discontinuously (for example, may change in discrete steps or be step-graded) as a function of depth.

Figure 10:
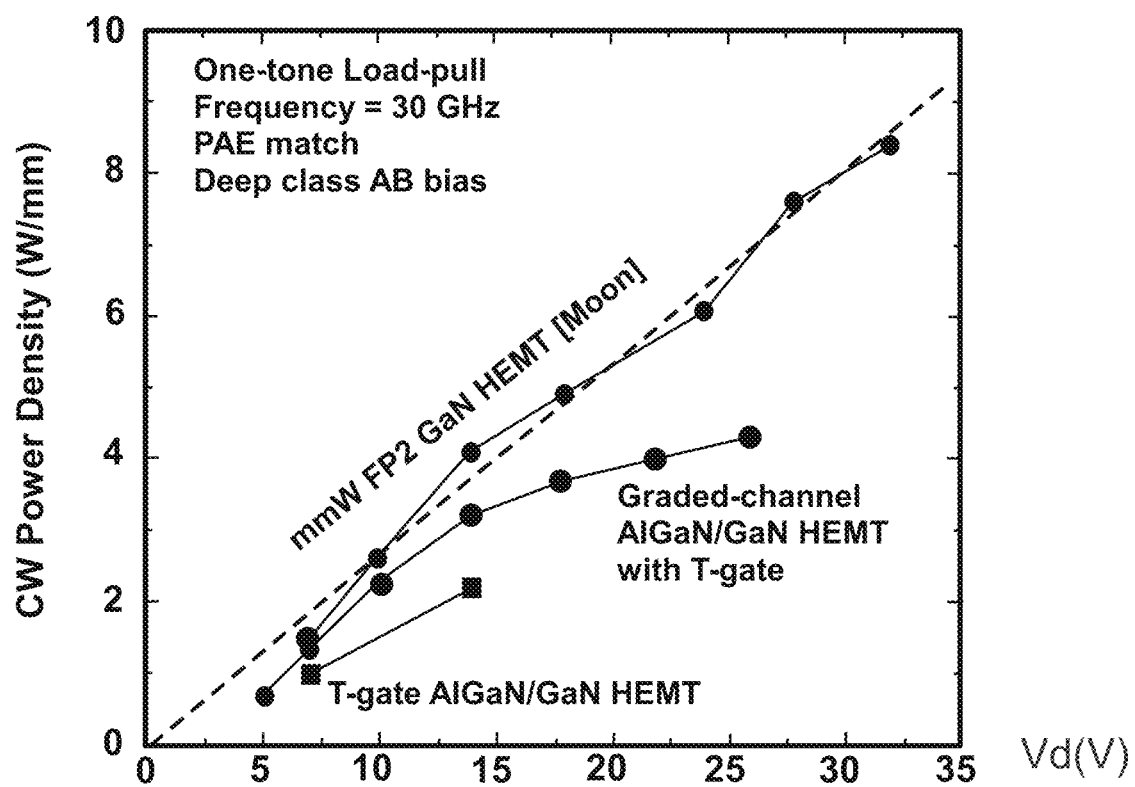
FIG. 10 illustrates the CW power density versus the drain voltage (Vd) for 2 embodiments according to this presentation, as well as those of a prior art device.
Figure 11:
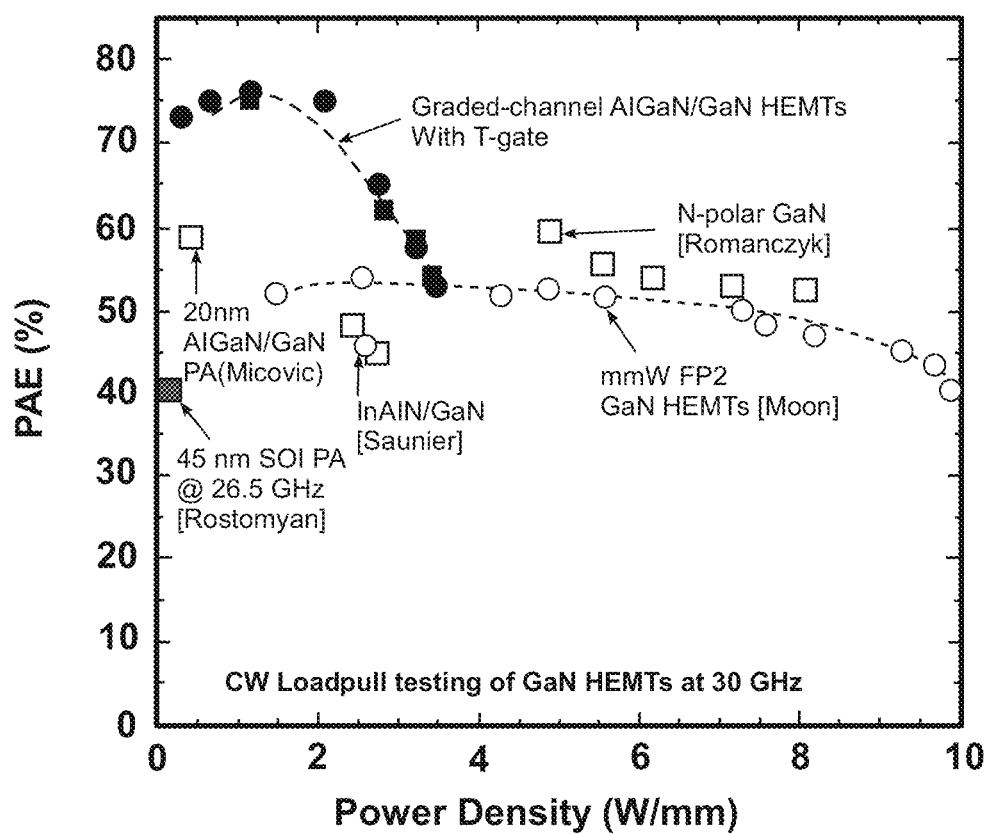
FIG. 11 illustrates the power added efficiency (PAE) versus power density for an embodiment according to this presentation and for 5 prior art devices.

FIGS. 10 and 11 respectively illustrate the output power density and Power Added Efficiency at 30 GHz of graded-channel AlGaN/GaN HEMTs according to this presentation. For example, a graded-channel AlGaN/GaN HEMTs with 60 nm gate length demonstrated a power density of 2.1 W/mm and Power Added Efficiency (PAE) of 70% at 30 GHz. The PAE is roughly 72-76% for power densities <2.5 W/mm; the PAE is significantly less than 70% for larger power densities. At a power density of 2.1 W/mm, the graded-channel T-gates have a PAE of 75%.

Figure 12:
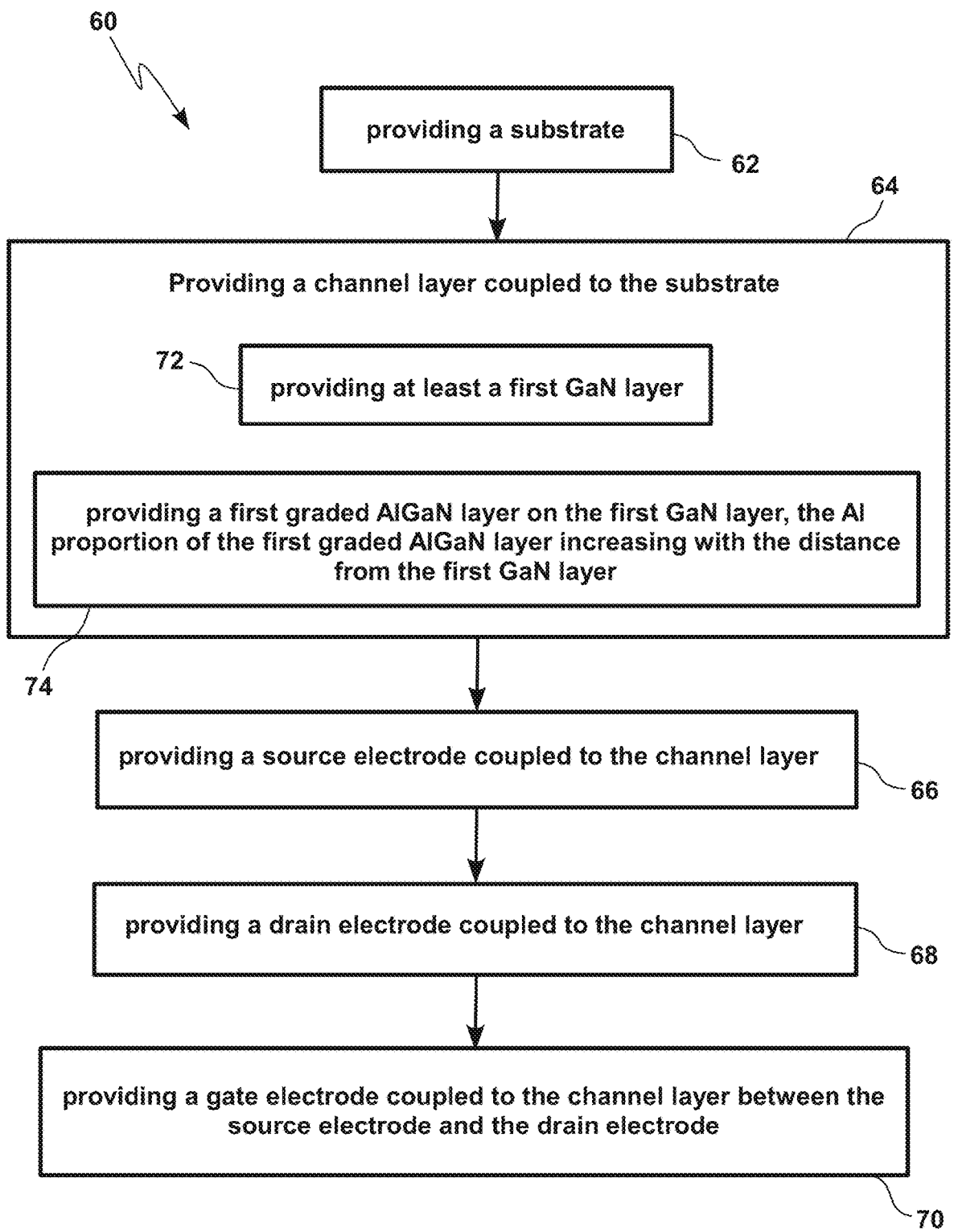
FIG. 12 illustrates a method of manufacturing a HEMT according to this presentation.

FIG. 12 illustrates a method 60 of manufacturing a HEMT according to embodiments of this presentation, such as detailed hereabove in relation with FIGS. 3-11, the method comprising: providing (62) a substrate; providing (64) a channel layer coupled to the substrate; providing (66) a source electrode coupled to the channel layer; providing (68) a drain electrode coupled to the channel layer; and providing (70) a gate electrode coupled to the channel layer between the source electrode and the drain electrode; wherein said providing (64) the channel layer comprises: providing (72) at least a first GaN layer; and providing (74) a first graded AlGaN layer on the first GaN layer, the Al proportion of the first graded AlGaN layer increasing with the distance from the first GaN layer.

Modern RF communication systems continue to evolve with spectrally efficient complex modulation schemes, higher instantaneous bandwidth, and Multiple-input-multiple-output (MIMO) to support the growing need for higher data rate and fast decision-making process. Since the millimeter wave (mmW) spectrum provides a higher useable RF bandwidth, there is a growing demand for high-performance mmW amplifiers for 5G frequency range 2 (FR2), high data-rate satellite communications and various defense applications. As for 5G FR2 applications, high efficiency and linearity of amplifiers are required to support complex waveforms with high peak-to-average-power ratio (PAPR) and large instantaneous bandwidth up to 1 GHz. Recently, CMOS-based 28 GHz power amplifiers were demonstrated with 40% peak power-added efficiency (PAE) at 18.9 dBm saturated output power using 45 nm n-type CMOS SOI technology [6]. With a 64-Quadrature amplitude modulation (QAM) Orthogonal frequency division multiplexing (OFDM) signal with 800 MHz bandwidth, the nMOS PA demonstrated an average output power of 9.8 dBm with PAE of 14.8%.

A commercial 1 Watt GaN amplifier for 5G applications offers 8% PAE at 23 dBm linear output power with 3% Error vector magnitude (EVM) [7].

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

All elements, parts and steps described herein are preferably included. It is to be understood that any of these elements, parts and steps may be replaced by other elements, parts and steps or deleted altogether as will be obvious to those skilled in the art.

The following documents are hereby incorporated by reference:

[1] Y. Cao and D. Jena, "High-mobility window for two-dimensional electron gases at ultrathin AlN/GaN heterostructures" Applied. Phys. Lett., vol. 90, p.182112, 2007

[2] A. Hickman et al., "High breakdown voltage in RF AlN/GaN/AlN quantum well HEMTs", IEEE Electron Dev. Lett., vol. 40, p. 1293, 2019

[3] J. S. Moon et al., "Novel high-speed linear GaN technology with high efficiency", 2019 *IEEE MTT-S International Microwave Symposium (IMS)*, Boston, Mass., USA, 2019, pp. 11304132, doi: 10.1109/MWSYM.2019.8700832.

[4] J. S. Moon et al., "Graded-channel AlGaN/GaN HEMTs with record Power-added-efficiency >70% at 30 GHz" Electronics Letters, Vol. 56, p. 678, 2020.

[5] J. S. Moon et al., "Highly scaled linear GaN HEMT structures", U.S. patent application Ser. No. 16/217,714

[6] N. Rostomyan et al., "Comparison of pMOS and nMOS 28 GHz high efficiency linear power amplifiers in 45 nm CMOS SOI", IEEE Conference on RF/Microwave Power amplifiers for Radio and Wireless Applications (PAWR), pp. 26-28, 2018

[7] Commercial Product Datasheet from Qorvo GPF4001, 26-30 GHz GaN module

[8] Sakib Muhtadi, Seong Mo Hwang, Antwon Coleman, Fatima Asif, Grigory Simin, M. V. S. Chandrashekhar, and Asif Khan, High Electron Mobility Transistors With Al0.65Ga0.35N Channel Layers on Thick AlN/Sapphire Templates, IEEE Electron Device Letters, Vol. 38, No. 7, July 2017

[9] Ming Xiao, Jincheng Zhang, Xiaoling Duan, Weihang Zhang, Hengsheng Shan, Jing Ning and Yue Hao, High performance Al0.10Ga0.90N channel HEMTs, IEEE Electron Device Letters, Vol. 39, No. 8, August 2018.

[10] Keisuke Shinohara et al. "Scaling of GaN HEMTs and Schottky Diodes For Submillimeter-Wave MMIC Applications"; IEEE Transactions on Electron Devices, Vol. 60, No. 10, October 2013.

The invention claimed is:

1. A HEMT comprising:
a substrate;
a channel layer coupled to the substrate;
a source electrode coupled to the channel layer;
a drain electrode coupled to the channel layer; and
a gate electrode coupled to the channel layer between the source electrode and the drain electrode;
wherein the channel layer comprises:
at least a first GaN layer; and
a first graded AlGaN layer on the first GaN layer, the Al proportion of the first graded AlGaN layer increasing with the distance from the first GaN layer; and
wherein the HEMT comprises an AlN barrier layer on the channel layer.

2. The HEMT of claim 1, wherein said substrate is a SiC substrate.

3. The HEMT of claim 1 further comprising:
a back-barrier layer between the substrate and the channel layer.

4. The HEMT of claim 3, wherein the back-barrier layer is an AlN back-barrier layer.

5. A HEMT comprising:
a substrate;
a channel layer coupled to the substrate;
a source electrode coupled to the channel layer;
a drain electrode coupled to the channel layer; and
a gate electrode coupled to the channel layer between the source electrode and the drain electrode;
wherein the channel layer comprises:
at least a first GaN layer; and
a first graded AlGaN layer on the first GaN layer, the Al proportion of the first graded AlGaN layer increasing with the distance from the first GaN layer;
wherein the first graded AlGaN layer comprises $Al_xGa_{1-x}N$; wherein x varies from 0 to 0.2 over a thickness of the first graded AlGaN layer;
wherein the thickness of the first graded AlGaN layer is 1 to 6 nanometers; and
wherein the thickness of the first GaN layer is 10 to 40 nanometers.

6. A HEMT comprising:
a substrate;
a channel layer coupled to the substrate;
a source electrode coupled to the channel layer;
a drain electrode coupled to the channel layer; and
a gate electrode coupled to the channel layer between the source electrode and the drain electrode;
wherein the channel layer comprises:
at least a first GaN layer; and
a first graded AlGaN layer on the first GaN layer, the Al proportion of the first graded AlGaN layer increasing with the distance from the first GaN layer;
wherein the first graded AlGaN layer comprises $Al_xGA_{1-x}N$; wherein x varies from 0 to 0.2 over a thickness of the first graded AlGaN layer; and
wherein the thickness of the first graded AlGaN layer is 1 to 6 nanometers;
the HEMT comprising on top of the channel layer an AlN barrier layer having a thickness of 2 to 4 nanometers.

7. The HEMT of claim 6, comprising on top of the barrier layer an AlGaN capping layer having a thickness smaller than 2 nanometers.

8. The HEMT of claim 6, comprising a passivation layer on top of and in contact with the barrier layer.

9. A method of manufacturing a HEMT comprising:
providing a substrate;
providing a channel layer coupled to the substrate;
providing a source electrode coupled to the channel layer;
providing a drain electrode coupled to the channel layer; and
providing a gate electrode coupled to the channel layer between the source electrode and the drain electrode;
wherein said providing a channel layer comprises:
providing at least a first GaN layer; and
providing a first graded AlGaN layer on the first GaN layer, the Al proportion of the first graded AlGaN layer increasing with the distance from the first GaN layer;
the method further comprising providing an AlN barrier layer on the channel layer.

10. The method of claim 9, wherein said substrate is a SiC substrate.

11. The method of claim 9 further comprising providing a back-barrier layer between the substrate and the channel layer.

12. The method of claim 11, wherein the back-barrier layer is an AlN back-barrier layer.

13. A method of manufacturing a HEMT comprising:
providing a substrate;
providing a channel layer coupled to the substrate;
providing a source electrode coupled to the channel layer;
providing a drain electrode coupled to the channel layer; and
providing a gate electrode coupled to the channel layer between the source electrode and the drain electrode;

wherein said providing a channel layer comprises:
providing at least a first GaN layer; and
providing a first graded AlGaN layer on the first GaN layer, the Al proportion of the first graded AlGaN layer increasing with the distance from the first GaN layer;
wherein the first graded AlGaN layer comprises $Al_xGA_{1-x}N$; wherein x varies from 0.01 to 0.2 over a thickness of the first graded AlGaN layer;
wherein the thickness of the first graded AlGaN layer is 1 to 6 nanometers; and
wherein the thickness of the first GaN layer is 10 to 40 nanometers.

14. A method of manufacturing a HEMT comprising:
providing a substrate;
providing a channel layer coupled to the substrate;
providing a source electrode coupled to the channel layer;
providing a drain electrode coupled to the channel layer; and
providing a gate electrode coupled to the channel layer between the source electrode and the drain electrode;
wherein said providing a channel layer comprises:
providing at least a first GaN layer; and
providing a first graded AlGaN layer on the first GaN layer, the Al proportion of the first graded AlGaN layer increasing with the distance from the first GaN layer;
wherein the first graded AlGaN layer comprises $Al_xGA_{1-x}N$; wherein x varies from 0.01 to 0.2 over a thickness of the first graded AlGaN layer; and
wherein the thickness of the first graded AlGaN layer is 1 to 6 nanometers;
the method further comprising providing on top of the channel layer an AlN barrier layer having a thickness of 2 to 4 nanometers.

15. The method of claim 14, comprising providing on top of the barrier layer an AlGaN capping layer having a thickness smaller than 2 nanometers.

16. The method of claim 14, comprising providing a passivation layer on top of and in contact with the barrier layer.

* * * * *